United States Patent [19]

Haushalter

[11] Patent Number: 5,372,187
[45] Date of Patent: Dec. 13, 1994

[54] DUAL CORRUGATED FIN MATERIAL

[75] Inventor: Frederick W. Haushalter, Kenton, Ohio

[73] Assignee: Robinson Fin Machines, Inc., Kenton, Ohio

[21] Appl. No.: 66,535

[22] Filed: May 24, 1993

[51] Int. Cl.$^5$ .............................................. F28F 7/00
[52] U.S. Cl. ................................... 165/109.1; 165/152
[58] Field of Search ..................... 165/109.1, 152, 153

[56] References Cited

U.S. PATENT DOCUMENTS

| | | | |
|---|---|---|---|
| 2,135,432 | 11/1938 | Brodton | 165/152 X |
| 3,262,495 | 7/1966 | Baird | 165/152 |
| 3,712,372 | 1/1973 | Tranel | 165/152 |
| 5,036,909 | 8/1991 | Whitehead et al. | 165/152 X |

Primary Examiner—John C. Fox
Attorney, Agent, or Firm—Barbara Joan Haushalter

[57] ABSTRACT

An improved heat transfer means provides for a dual corrugated fin material which improves heat transfer by increasing the surface area of the fin without a corresponding increase in volume. The improved heat transfer means comprises a fin generated from a flat sheet of metal. The fin includes a first corrugated pattern having a first height, and a second corrugated pattern having a second height, wherein the first pattern is integral in the second pattern and the first height is less than the second height.

14 Claims, 3 Drawing Sheets

DUAL CORRUGATED FIN MATERIAL

BACKGROUND OF THE INVENTION

The present invention relates to heat transfer devices and, more particularly, to a dual corrugated fin material, extended surface, for use in air cooled electronic high density applications, particularly those having small cubic volume space restrictions.

Heat transfer devices, such as heat sinks and heat exchangers, are widely used for absorptive thermal protection. To achieve this, heat transfer devices are made of various types of corrugated fin material to allow energy transfer during passage of air and/or fluid through the device.

It is known in the art that heat transfer can be improved in various applications by increasing the surface area of the fin material. The surface area of the fin material can be increased by either increasing the height of the fin material; increasing the number of fins per inch of the fin material; or increasing the width or flow length of the fluid along the fin. However, each of these improvements has tangible limits. For example, the part incorporating the fin material typically has a height and width limitation, which the fin material must adhere to in order to fit in the part. This is particularly the case with compact parts such as medical equipment, space applications, and computers, where increasing the size of the fin material and, therefore, the heat transfer device, is extremely undesirable. Additionally, increases in the height and/or width of the fin material does not create a directly proportional increase in the performance or efficiency of the heat transfer device. The other improvement technique, increasing the number of fins per inch, is theoretically sound, but realistically limited. The number of fins per inch is limited by the performance and ability of the corrugation means for corrugating the fin material.

It is seen then that there exists a need for a fin having improved heat transfer, without compromising the size of the part in which the fin is used.

SUMMARY OF THE INVENTION

This need is met by the dual corrugated fin material according to the present invention, which provides for an increased surface area to improve the heat transfer capability of the heat transfer device incorporating the fin material. Generating fin according to the present invention provides a fin material having increased surface area, without increasing the height, width, or number of fins per inch.

In accordance with one aspect of the present invention, an improved heat transfer means comprises a fin generated from a flat sheet of metal. The fin includes a first corrugated pattern having a first height, and a second corrugated pattern having a second height, wherein the first pattern is integral in the second pattern and the first height is less than the second height.

The present invention also includes a method for improving heat transfer. The method comprises the steps of providing a flat sheet of metal. A first corrugated pattern is formed from the flat sheet of metal, with first corrugated pattern having a first height. A second corrugated pattern is then formed from the flat sheet of metal, with the second corrugated pattern having a second height, wherein the first height is less than the second height.

Accordingly, it is an object of the present invention to provide an improvement in the thermal performance of a heat transfer device. It is also an object of the present invention to provide such an improvement wherein the volume of space required for the heat transfer device is not increased. It is a further object to provide such an improvement wherein surface area on the fin is increased, without a corresponding increase in the height, width, or depth of the fin material.

Other objects and advantages of the invention will be apparent from the following description, the accompanying drawings and the appended claims.

DETAILED DESCRIPTION OF THE PREFERRED EMBODIMENTS

The present invention provides for a turbulizer or fin having a dual corrugated pattern which improves heat transfer by increasing the surface area of the fin without a corresponding increase in volume. A fin material generated in accordance with the present invention is particularly useful for air cooled electronic high density applications where cubic volume is limited.

Figure 1:
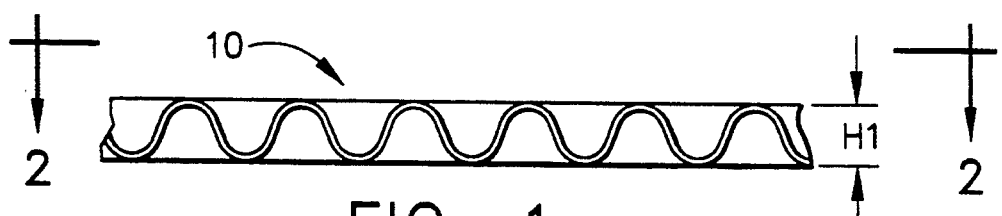
FIG. 1 is a side view of a fin material generated with only the first of the dual corrugations.
Figure 2:
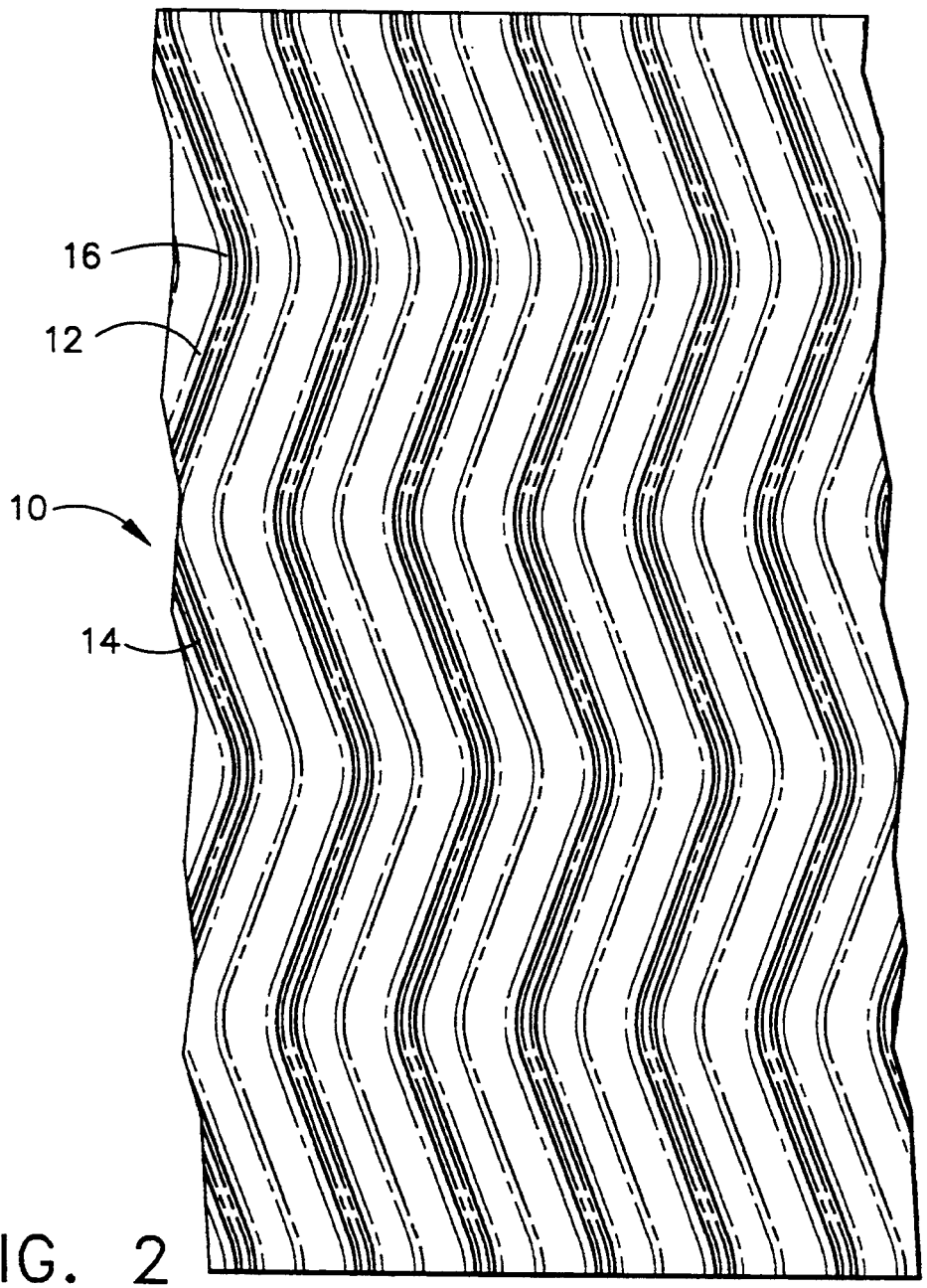
FIG. 2 is a top view taken along section line 2—2 of FIG. 1.

Referring now to the drawings, in FIG. 1 there is illustrated a side view of a corrugated fin material 10 which can be generated from a flat sheet of metal material using any suitable fin forming means, such as a fin machine. As best illustrated in FIG. 2, the fin material 10 comprises a plurality of connecting interposing lines of fin 12 and 14. The fin material 10 of FIG. 1 is shown having been generated to form a first corrugated pattern, such as a ruffled fin pattern 16, having a first height, $H_1$.

Figure 3:
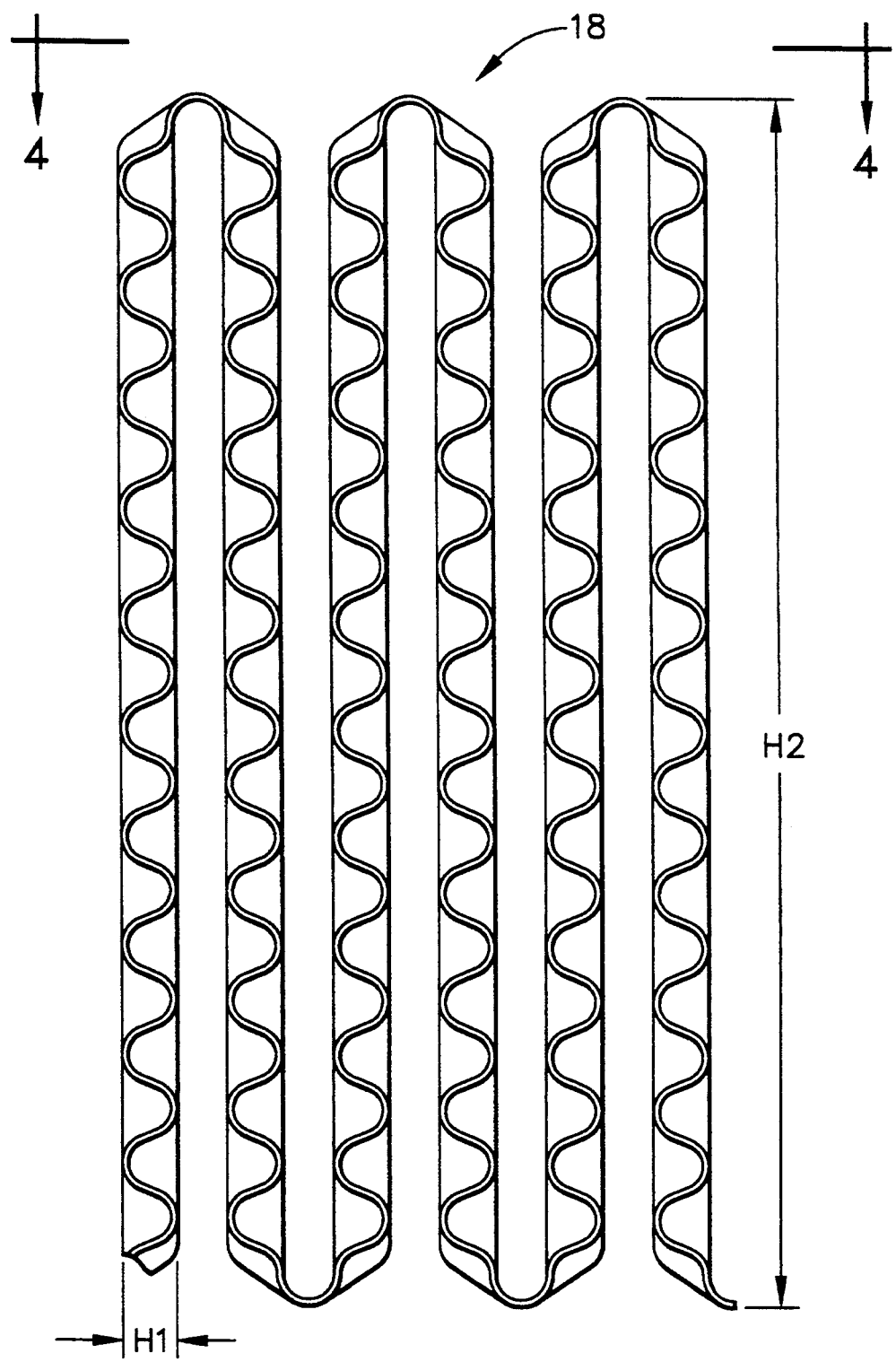
FIG. 3 is a side view of a fin material generated with both of the dual corrugations.

In accordance with the present invention, the fin material 10 of FIG. 1 is corrugated a second time to generate a turbulizer 18, as illustrated in FIG. 3. This forms a second corrugated pattern, such as a plain fin pattern 20, having a second height, $H_2$. The first corrugation illustrated in FIG. 1 is integral in the second corrugation, with the integral corrugations best illustrated in FIG. 3. In the illustrated embodiment of the present invention, the first height $H_1$ is less than the second height $H_2$. Of course, as will be obvious to those skilled in the art, the second height $H_2$ may, alternatively, be smaller than the first height $H_1$, without departing from the scope of the invention.

Figure 4:
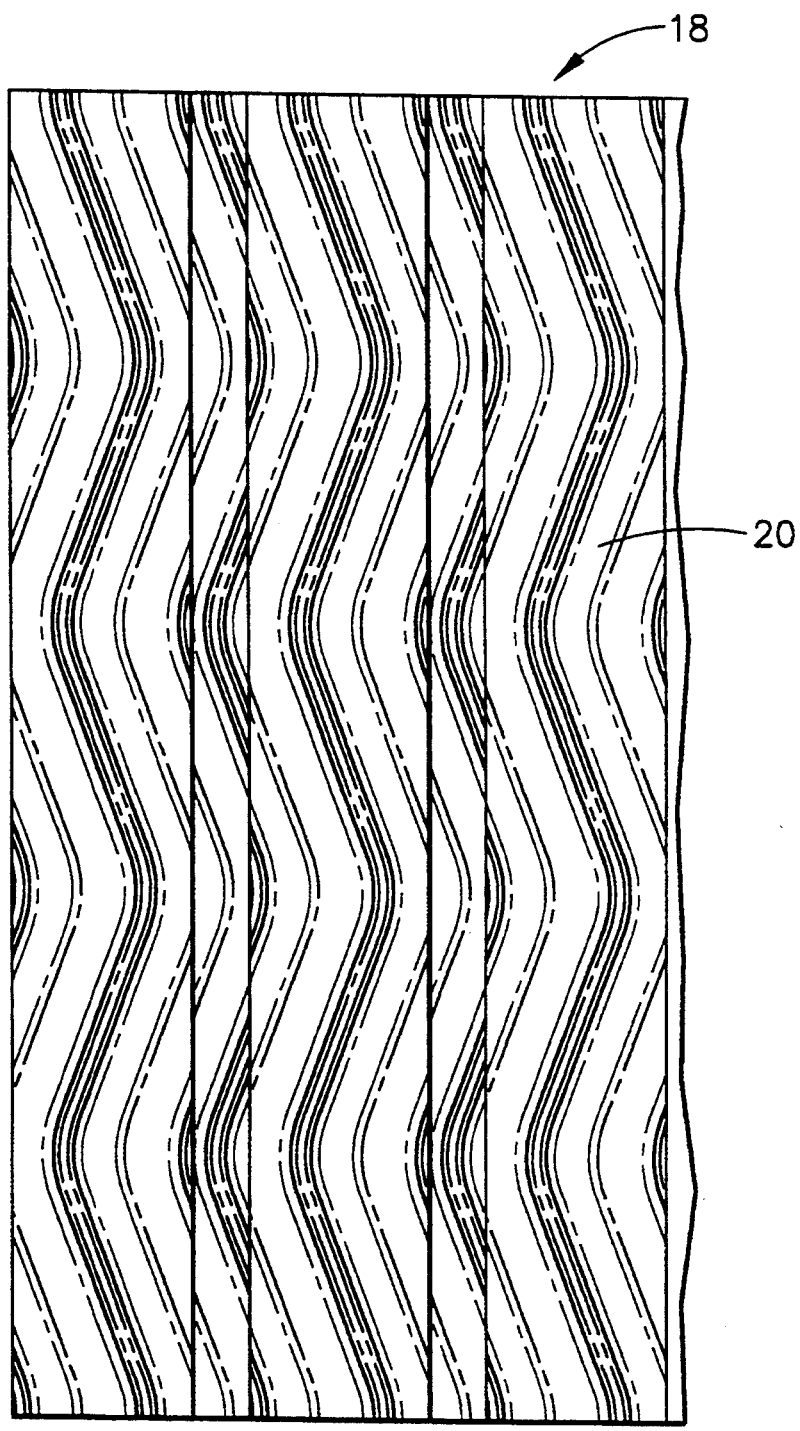
FIG. 4 is a top view taken along section line 4—4 of FIG. 3.

The first corrugated pattern of fin 10, illustrated in FIGS. 1 and 2, combined with the second corrugated pattern of fin to generate the turbulizer 18, illustrated in FIGS. 3 and 4, can be formed by any suitable means, such as by the Self Feeding Continuous Forming Device disclosed in U.S. Pat, No. 3,760,624, incorporated herein by reference. Whether the dual corrugations are formed simultaneously, or separately, the result of generating a turbulizer 18 having improved heat transfer capabilities is the same. It is to be noted that while the first corrugated pattern 16 is shown as being a ruffled fin, and the second corrugated pattern 20 is shown as being a plain fin, the concept of dual corrugated fin of the present invention is equally applicable to any single or multiple fin patterns.

It is known that heat transfer ability of a fin material is directly related to surface area of the fin. As will be obvious to those skilled in the art, a prior art fin having a width, depth, and height $H_2$, identical to that of the dual corrugated turbulizer 18, and which can only have a single corrugated pattern as known in the art, cannot possibly provide the heat transfer of the dual corrugated turbulizer 18 illustrated in FIG. 3. The dual corrugations resulting in the fin material 18 provide for an increased surface area, thereby increasing heat transfer capability. It is an advantage of the present invention that this increased surface area is provided without increasing the height, width, or number of fins per inch of the resultant fin material 18.

Having described the invention in detail and by reference to the preferred embodiment thereof, it will be apparent that other modifications and variations are possible without departing from the scope of the invention defined in the appended claims.

What is claimed is:

1. A turbulizer comprising:
   a plurality of connecting interposing lines of fin generated from a flat sheet of metal, said plurality of connecting interposing lines of fin defining a dual corrugated pattern including,
   a first corrugated pattern having a first height, and
   a second corrugated pattern having a second height.

2. A turbulizer as claimed in claim 1 wherein said first corrugated pattern is integral in said second corrugated pattern.

3. A turbulizer as claimed in claim 1 wherein said first height is less than said second height.

4. A turbulizer as claimed in claim 1 wherein said first corrugated pattern and said second corrugated pattern are formed separately.

5. A turbulizer as claimed in claim 1 wherein said first corrugated pattern and said second corrugated pattern are formed simultaneously.

6. A heat transfer means comprising:
   a flat sheet of metal;
   a first corrugated pattern formed from said flat sheet of metal to generate a first fin, said first corrugated pattern having a first height; and
   a second corrugated pattern formed integrally with said first corrugated pattern, said second corrugated pattern having a second height unequal to said first height.

7. A heat transfer means as claimed in claim 6 wherein said first corrugated pattern is integral in said second corrugated pattern.

8. A heat transfer means as claimed in claim 6 wherein said first corrugated pattern and said second corrugated pattern are formed separately.

9. A heat transfer means as claimed in claim 6 wherein said first corrugated pattern and said second corrugated pattern are formed simultaneously.

10. A method for improving heat transfer comprising the steps of:
    providing a sheet of metal;
    forming a first corrugated pattern from said sheet of metal, said first corrugated pattern having a first height; and
    forming a second corrugated pattern from said sheet of metal, said second corrugated pattern having a second height.

11. A method for improving heat transfer as claimed in claim 10 wherein said first corrugated pattern is integral in said second corrugated pattern.

12. A method for improving heat transfer as claimed in claim 10 wherein said first height is less than said second height.

13. A method for improving heat transfer as claimed in claim 10 wherein the step of forming a first corrugated pattern occurs prior to the step of forming a second corrugated pattern.

14. A method for improving heat transfer as claimed in claim 10 wherein the steps of forming a first corrugated pattern and forming a second corrugated pattern occur simultaneously.

* * * * *